United States Patent [19]

Gay et al.

[11] Patent Number: 5,477,076
[45] Date of Patent: Dec. 19, 1995

[54] INTEGRATED CIRCUIT HAVING AN ON CHIP THERMAL CIRCUIT REQUIRING ONLY ONE DEDICATED INTEGRATED CIRCUIT PIN AND METHOD OF OPERATION

[75] Inventors: James G. Gay, Pflugerville; William B. Ledbetter, Jr., Austin, both of Tex.

[73] Assignee: Motorola, Inc., Schaumburg, Ill.

[21] Appl. No.: 297,280

[22] Filed: Aug. 29, 1994

Related U.S. Application Data

[63] Continuation of Ser. No. 158,323, Nov. 29, 1994, Pat. No. 5,376,819.

[51] Int. Cl.$^6$ .......................... H01L 31/058; H01L 23/48
[52] U.S. Cl. .......................... 257/467; 257/776; 257/777; 338/22 R; 338/22 SD
[58] Field of Search .................................. 257/467, 776, 257/777; 338/22 R, 22 SD

[56] References Cited

U.S. PATENT DOCUMENTS

| | | |
|---|---|---|
| 5,140,394 | 8/1992 | Cobb, III et al. ................ 257/467 |
| 5,141,334 | 8/1992 | Castles ............................. 257/467 |
| 5,213,416 | 5/1993 | Neely et al. ..................... 374/178 |
| 5,230,564 | 7/1993 | Bartilson et al. ............... 257/467 |
| 5,376,819 | 12/1994 | Gay et al. ....................... 257/467 |

*Primary Examiner*—Ngân V. Ngô
*Attorney, Agent, or Firm*—Robert L. King

[57] ABSTRACT

An integrated circuit implements an on chip thermal circuit (12) for measuring temperature of an operating integrated circuit die (10) by requiring only one dedicated integrated circuit pin (16). A second integrated circuit pin (18) is utilized but is also connected directly connected to other circuitry (14) on the integrated circuit and is used by the other circuitry at the same time that the integrated circuit die temperature is being measured. In one form, the second integrated circuit pin is a ground terminal. Error voltages coupled to the ground terminal may be removed from the temperature calculation by an external differential amplifier (24).

6 Claims, 1 Drawing Sheet

5,477,076

INTEGRATED CIRCUIT HAVING AN ON CHIP THERMAL CIRCUIT REQUIRING ONLY ONE DEDICATED INTEGRATED CIRCUIT PIN AND METHOD OF OPERATION

This is a continuation of application Ser. No. 08/158,323, filed Nov. 29, 1994, now U.S. Pat. No. 5,376,819.

FIELD OF THE INVENTION

The present invention generally relates to integrated circuits, and more particularly, to the monitoring of thermal characteristics of an operating integrated circuit.

BACKGROUND OF THE INVENTION

An important operating characteristic of an integrated circuit is the temperature of the integrated circuit's die when the integrated circuit is fully powered and in a normal operating mode of operation. Such a temperature measurement is often desired at a final package test when the integrated circuit is in the same form as will be used by an end user. To satisfy this need, others have used an on-chip resistor connected to two dedicated external pins of the integrated circuit. The external pins have no other function than to implement the temperature measurement function. An example of an integrated circuit having two dedicated pins for temperature measurement of the integrated circuit die is the MC88110 reduced instruction set microprocessor.

The temperature of the integrated circuit having an on-chip resistor is measured by using a current source reference and forcing a known current thru the known resistance of the on-chip resistor. A resulting voltage across the two dedicated integrated circuit pins is then measured. The resulting voltage is proportional to the temperature of the operating integrated circuit. In other words, as the temperature of the operating integrated circuit die varies, the resistance varies proportionately which results in a proportional change in voltage measured across the two dedicated integrated circuit pins. The two dedicated integrated circuit pins are required in order to isolate internally generated noise and other circuit parameters from the two integrated circuit pins. Any voltage, current, resistance or impedance which is coupled to the two integrated circuit pins from internal to the integrated circuit will modify the voltage potential between the two integrated circuit pins and result in an incorrect temperature measurement. However, the price of two dedicated integrated circuit pins to implement a measurement function is costly, even in the most advanced very large scale integrated circuits.

Another type of integrated circuit which uses a plurality of resistors connected between the integrated circuit's external pins is a resistor network integrated circuit. However, this type of integrated circuit functions only to provide a user with a plurality of possible resistance values depending upon which pins of the integrated circuit are connected. No other operating circuitry is typically implemented in such circuits.

Yet another known type of integrated circuit which provides a signal from which an operating die temperature may be derived utilizes a significant amount of dedicated internal circuitry, such as an analog-to-digital (A/D) circuit and a storage register, to provide the signal at a single dedicated output pin of the integrated circuit. The additional internal circuitry which is required to implement this temperature measurement function is often prohibitive in many large scale integration designs.

SUMMARY OF THE INVENTION

In accordance with one form of the invention, there is provided an integrated circuit having an on chip thermal circuit requiting only one dedicated integrated circuit pin and a method of implementing a single pin on chip thermal circuit in an integrated circuit. The integrated circuit comprises a die and a first integrated circuit pin which is dedicated solely for use with the on chip thermal circuit. A second integrated circuit pin is also provided. An integrated circuit die thermal sensing circuit is located on the die and directly connected to the first integrated circuit pin and to the second integrated circuit pin. The integrated circuit die thermal sensing circuit comprises a material which has a physical characteristic which varies in a manner proportional to variation of temperature of the material. A functional operating circuit is located on the die and is connected directly to the second integrated circuit pin. The functional operating circuit performs a predetermined operating function within the integrated circuit at the same time the integrated circuit die thermal sensing circuit provides an output signal which indicates an operating temperature of the die. The second integrated circuit pin is used by both the integrated circuit die thermal sensing circuit and the functional operating circuit.

These and other features, and advantages, will be more clearly understood from the following detailed description taken in conjunction with the accompanying drawings. It is important to point out that there may be other embodiments of the present invention which are not specifically illustrated.

DETAILED DESCRIPTION OF A PREFERRED EMBODIMENT

Figure 1:
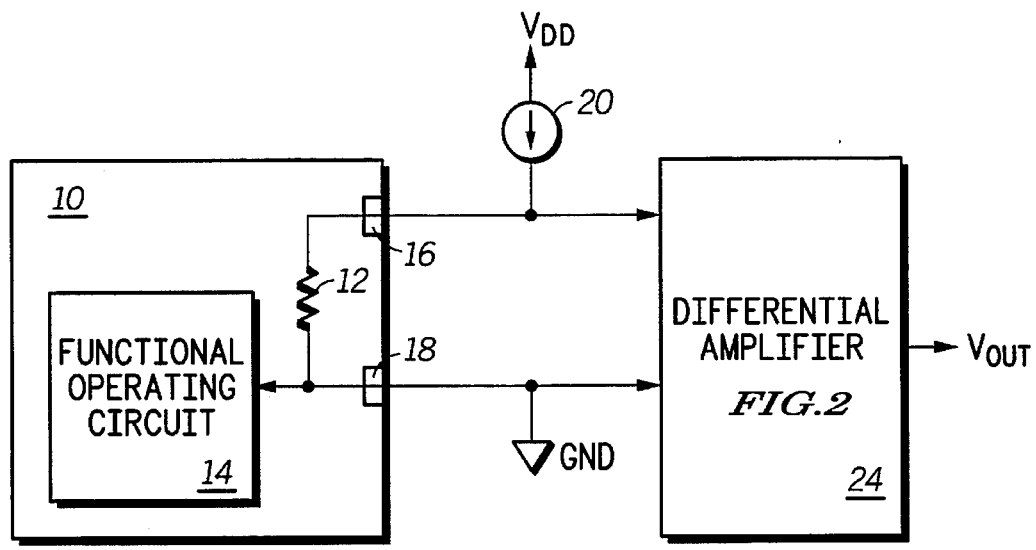
FIG. 1 illustrates in block diagram form an on-chip die thermal sensing circuit in accordance with the present invention.

Illustrated in FIG. 1 is an integrated circuit die 10 in accordance with the present invention. Although not fully illustrated as a packaged integrated circuit for purposes of illustrating the present invention, integrated circuit die 10 should be considered as a fully encapsulated die in a completed integrated circuit chip. Integrated circuit die 10 generally has a die thermal sensing circuit 12, a functional operating circuit 14, a first integrated circuit pin 16, and a second integrated circuit pin 18. Also illustrated is a constant current source 20 and a differential amplifier 24.

In the illustrated form, die thermal sensing circuit 12 is implemented as a resistor having a first terminal connected to first integrated circuit pin 16 and having a second terminal connected to second integrated circuit pin 18. In the illustrated form, the second integrated circuit pin 18 is a ground reference pin of integrated circuit die 10. Functional operating circuit 14 has a terminal connected directly to the second integrated circuit pin 18, thereby making the second integrated circuit pin a common integrated circuit pin which is common to both the die thermal sensing circuit 12 and the functional operating circuit 14. A constant current source 20 has a first terminal connected to a power supply voltage, such as $V_{DD}$, and has a second terminal connected to both the fast integrated circuit pin 16 and a first input of differential amplifier 24. A second input of differential amplifier 24 is connected to the second integrated circuit pin 18. An output of differential amplifier 24 provides an output voltage, Vout, which is referenced to a ground reference terminal and is proportional to temperature.

In operation, an operating temperature of integrated circuit die 10 may be accurately measured while circuit die 10 is fully operational. Further, this function only requires one dedicated integrated circuit pin, the first integrated circuit pin because the second integrated circuit pin is used concurrently by the functional operating circuit 14. Functional operating circuit 14 performs a predetermined operating function within the integrated circuit 10 at the same time the present invention is utilized to determine the die operating temperature. Examples of the functionality of operating circuit 14 might include an execution unit, digital logic circuitry, address translation circuitry, a memory, etc.. In one form, the die thermal sensing circuit 12 is implemented as a resistor. If a metal resistor is utilized, a resistor may be formed which is susceptible to average temperature changes of the integrated circuit die 10 and which provides a temperature coefficient of approximately 1.2 Ohms/degree Centigrade. It should be well understood that other materials, such as polysilicon for example, may be used to implement die thermal sensing circuit 12. As constant current source 20 provides a constant reference current to integrated circuit die 10, a small predetermined voltage is developed across the resistance of die thermal sensing circuit 12. The resistance of die thermal sensing circuit 12 is proportional to the temperature of the die in accordance with the following equation:

$$\text{Resistance of circuit 12} = (\text{Die Temp.}) * (\text{Temp. Coefficient}) + K \quad (1)$$

where the die temperature is in units of degrees Centigrade, the temperature coefficient is in units of (Ohms/degree Centigrade), and K is a minimum resistance in Ohms which circuit 12 has. The temperature coefficient depends upon what material is selected as die thermal sensing circuit 12, but is conventionally known for a given temperature range. As the die temperature changes, so does the resistance of die thermal sensing circuit 12. An increase in die temperature causes an increase in the resistance of die thermal sensing circuit 12, and a decrease in die temperature causes a decrease in the resistance of die thermal sensing circuit 12. Since the current through the resistance of die thermal sensing circuit 12 is constant, the voltage which is developed across the resistance of die thermal sensing circuit 12 is also proportional to the temperature of the die. In other words, when the die temperature increases the voltage between the first integrated circuit pin 16 and the second integrated circuit pin 18 increases, and vice versa.

In a highly integrated circuit, such as a data processor for example, the amount of electrical current normally channeled to or "sunk" by a ground terminal from the functional operating circuit 14 can be substantial causing the ground potential to actually rise above zero volts. Such an operating condition would therefore create an error voltage between the first integrated circuit pin 16 and the second integrated circuit pin 18. The error voltage is known in the art by the term "ground bounce".

The present invention however can still be utilized even when ground bounce errors exist. The voltage variation across the resistance of die thermal sensing circuit 12 attributable to ground bounce is common mode with respect to the ground bounce voltage variation at the common or second integrated circuit pin 18.

Recognizing that the voltage variation due to ground bounce error which occurs across die thermal sensing circuit 12 is common mode makes it possible to eliminate the ground bounce error and thereby use only one dedicated integrated circuit pin for the die thermal sensing. Differential amplifier 24 may be used to subtract the common mode ground bounce noise from the output voltage between integrated circuit pins 16 and 18. Differential amplifier 24 therefore recovers a pure voltage which is proportional to the resistance of die thermal sensing circuit 12. In other words, differential amplifier 24 removes a common mode error component from a voltage differential between the first and second integrated circuit pins. Although two integrated circuit pins are utilized, it should be noted that the common or second integrated circuit pin 18 is already present on the integrated circuit and is never taken out of operational use during the die thermal measuring process.

Figure 2:
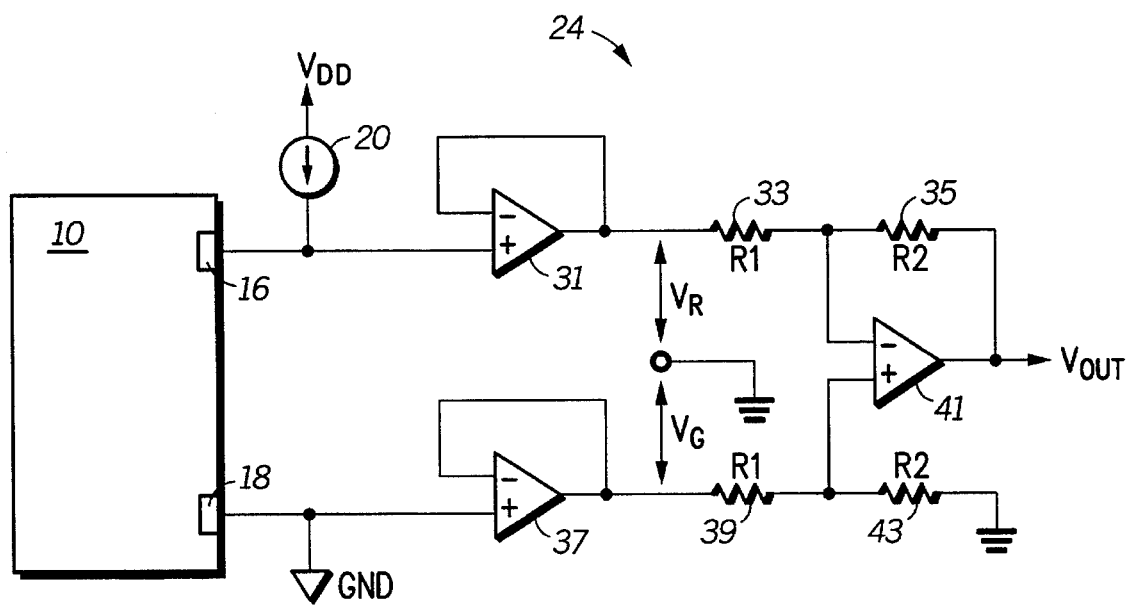
FIG. 2 illustrates in partial schematic form the differential amplifier of FIG. 1.

Illustrated in FIG. 2 is a detailed diagram of one form of a differential amplifier which may be used as differential amplifier 24 in connection with constant current source 20 and integrated circuit die 10. Elements in FIG. 2 which are the same as elements in FIG. 1 are identically numbered for clarification. Differential amplifier 24 has a first operational amplifier 31 having a first, noninverting (positive) input connected to integrated circuit pin 16. As was illustrated in FIG. 1, constant current source 20 has the first terminal thereof connected to power supply voltage $V_{DD}$ and the second terminal thereof connected to integrated circuit pin 16 of integrated circuit die 10. A second, inverting (negative) input of operational amplifier 31 is connected to an output thereof and to a first terminal of a resistor 33. A second terminal of resistor 33 is connected to a first terminal of a resistor 35. A second operational amplifier 37 has a first, noninverting (positive) input connected to integrated circuit pin 18 which is a ground terminal on the integrated circuit package and therefore connected to ground. A second, inverting (negative) input of operational amplifier 31 is connected to an output thereof and to a first terminal of a resistor 39. A second terminal of resistor 39 is connected to a first, noninverting (positive) input of a third operational amplifier 41 and to a first terminal of a resistor 43. A second terminal of resistor 43 is connected to a ground reference terminal. A second, inverting (negative) input of operational amplifier 41 is connected to both the second terminal of resistor 33 and the first terminal of resistor 35. A second terminal of resistor 35 is connected to an output of operational amplifier 41 and provides the output voltage Vout. In one form, the three operational amplifiers may be obtained by using the commercially available integrated circuit LF347 from National Semiconductor Corporation which contains four operational amplifiers. A fourth operational amplifier of an LF347 integrated circuit may be used as the constant current source 20.

In operation, operational amplifiers 31 and 37 are high impedance unity gain buffer stages which do not load integrated circuit pins 16 and 18. Operational amplifier 41 is configured as a differential amplifier and resistors 33, 35, 39 and 43 function to establish a gain of differential amplifier 24. For example, assume that resistors 33 and 39 have the same resistance, R1, and assume that resistors 35 and 43 have the same resistance R2. Further assume that the output voltage of operational amplifier 31 is $V_R$ referenced to a ground potential, and that the output voltage of operational amplifier 37 is $V_G$ referenced to the ground potential. The output voltage Vout may therefore be represented as:

$$\text{Vout} = [(R2)/(R1)] * [V_G - V_R] \quad (2)$$

where R1 is the resistance of each of resistors 33 and 39, and R2 is the resistance of each of resistors 35 and 43. As can be seen from equation 2, the ground bounce noise is totally subtracted from the output voltage as a result of the subtraction of $V_R$ from $V_G$. In other words, each of the $V_R$ and $V_G$ voltages is referenced to ground, and noise bounce which is injected into the ground is therefore neutralized and invisible to the final output voltage provided by differential amplifier 24.

It should be noted that many integrated circuits have scores of circuit pins in which there is more than one ground reference terminal pin. Any ground reference terminal may be used to implement the present invention but it is preferable to connect differential amplifier 24 to the same ground pin which the die thermal sensing circuit 18 is connected to. If other ground pins are connected to differential amplifier 24 than the ground pin which die thermal sensing circuit 18 is connected to, inductance and other electrical properties may create differential voltage potentials between the various ground circuit pins when the integrated circuit is operational.

The present invention may alternately be used without the assistance of external differential amplifier 24 and constant current source 20. For example, the resistance of die thermal sensing circuit 12 of integrated circuit die 10 may be measured at room temperature between integrated circuit pins 16 and 18 before the integrated circuit is powered up. Then the integrated circuit may be powered up and is operational for a sufficient amount of time to allow the die to achieve a characteristic operating die temperature. The power should then be disconnected from the integrated circuit and another resistance measurement of the die thermal sensing circuit 12 immediately made. The differing resistance values can be used in accordance with equation 1 to provide an average operating temperature of the integrated circuit. In this technique, ground bounce noise does not exist and is therefore irrelevant.

Thus it is apparent that there has been provided, in accordance with the present invention, an integrated circuit having an on chip thermal circuit requiring only one dedicated integrated circuit pin, and a method of operating the unique integrated circuit. An advantage of the present invention is the saving of an additional dedicated integrated circuit pin to provide a die temperature when the die is powered up and operational. Although the invention has been described and illustrated with reference to specific embodiments thereof, it is not intended that the invention be limited to these illustrative embodiments. For example, one may utilize many different types of die thermal sensing circuit 12 other than a resistor. Further, pins other than the illustrated ground pin which can function as the common integrated circuit pin 18 between the die thermal sensing circuit 12 and other operating circuitry may be used. For example, any fixed voltage potential integrated circuit pin may be used to implement the function of the common integrated circuit pin 18. It should also be noted that any type of circuitry, whether digital or analog and regardless of process type, may be used as the functional circuitry which is connected to the common integrated circuit pin 18. Another point which should be noted is that the present invention may be implemented by establishing a fixed voltage across the die thermal sensing circuit 12 and measuring the current thru die thermal sensing circuit 12 which is proportional to die temperature. Although the present invention has been disclosed in the context of a specific differential amplifier structure, other types of differential amplifiers may be used. Those skilled in the art will recognize that modifications and variations can be made without departing from the spirit of the invention. Therefore, it is intended that this invention encompass all such variations and modifications as fall within the scope of the appended claims.

We claim:

1. An integrated circuit having an on chip thermal circuit requiring only one dedicated integrated circuit pin, the integrated circuit comprising:

a die;

a first integrated circuit pin which is dedicated solely for use with the on chip thermal circuit;

a second integrated circuit pin;

an integrated circuit die thermal sensing circuit located on the die and directly connected to the first integrated circuit pin and to the second integrated circuit pin, the integrated circuit die thermal sensing circuit comprising a material which has a physical characteristic which varies in a manner proportional to variation of temperature of the material, the integrated circuit die thermal sensing circuit providing an output signal which indicates an operating temperature of the die;

a functional operating circuit also located on the die and coupled to the second integrated circuit pin, the functional operating circuit performing a predetermined operating function within the integrated circuit;

said second integrated circuit pin being used by both the integrated circuit die thermal sensing circuit and the functional operating circuit.

2. The integrated circuit of claim 1 further comprising: circuitry external to the integrated circuit and connected to the first and second integrated circuit pins, the circuitry measuring a voltage potential between the first integrated circuit pin and the second integrated circuit pin and removing any common mode voltage component coupled to the fixed voltage terminal to provide a voltage which is proportional to the operating temperature of the die.

3. A method of measuring an operating temperature of an integrated circuit die of an integrated circuit resulting from the integrated circuit receiving electrical power, comprising the steps of:

dedicating a single integrated circuit pin for use with the method of measuring, the single integrated circuit pin to measure the temperature;

selecting a second integrated circuit pin to use with the first integrated circuit pin, the second integrated circuit pin being additionally as a functional pin of the integrated circuit concurrent with measuring the temperature;

coupling a thermal sensing circuit which is integrated in the integrated circuit die to the first integrated circuit pin and to the second integrated circuit pin, the integrated circuit die thermal sensing circuit comprising a material which has a physical characteristic which varies in a manner proportional to variation of temperature of the material;

coupling a functional operating circuit integrated in the integrated circuit die to the second integrated circuit pin, the functional operating circuit performing a predetermined operating function within the integrated circuit; and providing an output signal between the first integrated circuit pin and the second integrated circuit which is mathematically proportional to the operating temperature of the die.

4. The method of claim 3 further comprising the step of: removing a common mode noise error from the output signal before translating the output signal from an electrical value to a temperature value.

5. An integrated circuit having an on chip integrated circuit die thermal sensing circuit, the integrated circuit comprising: an integrated circuit die;

a first integrated circuit pin which is dedicated solely for use in measuring a temperature of the integrated circuit die when the integrated circuit is receiving electrical power;

a second integrated circuit pin;

a thermal sensing circuit integrated in the integrated circuit die, the thermal sensing circuit having a first terminal coupled to the first integrated circuit pin and having a second terminal coupled to the second integrated circuit pin; and circuitry coupled to the second integrated circuit pin, the circuitry utilizing the second integrated circuit pin when operational, the first and second integrated circuit pins being used to provide a signal which is proportional to the temperature of the integrated circuit die.

6. The integrated circuit of claim 5 further comprising:

circuitry coupled to the first and second integrated circuit pins, the circuitry removing a common mode noise error from the signal which is proportional to the temperature of the integrated circuit before translating the signal from an electrical value to a temperature value.

* * * * *